(12) United States Patent
Picco et al.

(10) Patent No.: US 10,782,381 B2
(45) Date of Patent: Sep. 22, 2020

(54) NUCLEAR MAGNETIC MEASURING DEVICE

(71) Applicant: KROHNE AG, Basel (CH)

(72) Inventors: Facundo Picco, Dordrecht (NL); Luciano Martin Carletti, Dordrecht (NL)

(73) Assignee: KROHNE AG, Basel (CH)

(*) Notice: Subject to any disclaimer, the term of this patent is extended or adjusted under 35 U.S.C. 154(b) by 251 days.

(21) Appl. No.: 16/034,602

(22) Filed: Jul. 13, 2018

(65) Prior Publication Data
US 2019/0018099 A1 Jan. 17, 2019

(30) Foreign Application Priority Data
Jul. 13, 2017 (DE) .................. 10 2017 115 807

(51) Int. Cl.
*G01R 35/00* (2006.01)
*G01N 24/08* (2006.01)
*G01R 33/36* (2006.01)
*G01R 33/565* (2006.01)
*G01R 33/563* (2006.01)
*G01F 1/716* (2006.01)

(52) U.S. Cl.
CPC ............ *G01R 35/00* (2013.01); *G01F 1/716* (2013.01); *G01N 24/08* (2013.01); *G01R 33/3621* (2013.01); *G01R 33/3664* (2013.01); *G01R 33/563* (2013.01); *G01R 33/5659* (2013.01)

(58) Field of Classification Search
None
See application file for complete search history.

(56) References Cited

U.S. PATENT DOCUMENTS

| 5,903,150 A | 5/1999 | Roznitsky |
| 7,123,009 B1 | 10/2006 | Scott |
| 7,750,635 B2 | 7/2010 | Van Helvoort et al. |

(Continued)

FOREIGN PATENT DOCUMENTS

| DE | 102013003836 A1 | 5/2014 |
| DE | 102016114647 A1 | 2/2018 |

(Continued)

OTHER PUBLICATIONS

European Search Report Application No. EP 18 18 2764 Completed: Dec. 7, 2018; dated Jan. 7, 2019 5 pages.

*Primary Examiner* — Paresh Patel
(74) *Attorney, Agent, or Firm* — Whitmyer IP Group LLC

(57) ABSTRACT

A nuclear magnetic measuring device includes a measuring device having a control unit, a generator unit, a receiving unit, and a measuring signal path with an excitation signal path and a reaction signal path. A first switch is arranged such that, in a first state, the generator unit is connected to the excitation signal path and, in a second state, it is connected to a bypass signal path. A second switch is arranged such that, in the first state, the receiving unit is connected to the reaction signal path and, in a second state, it is connected to the bypass signal path. The control unit (i) controls the switches such that a part of the measuring signal path is bypassed, (ii) generates a test excitation signal, (iii) receives a test reaction signal, and (iv) determines an unstable property of the measuring signal path using the test excitation and reaction signals.

18 Claims, 6 Drawing Sheets

(56) References Cited

U.S. PATENT DOCUMENTS

| | | |
|---|---|---|
| 9,411,034 B2 | 8/2016 | Hofstede et al. |
| 2012/0001629 A1 | 1/2012 | Hopper et al. |
| 2014/0132263 A1* | 5/2014 | Hofstede ................ G01R 33/56 |
| | | 324/309 |

FOREIGN PATENT DOCUMENTS

| | | |
|---|---|---|
| EP | 1810047 B1 | 1/2013 |
| EP | 2733500 A1 | 10/2013 |

* cited by examiner

NUCLEAR MAGNETIC MEASURING DEVICE

TECHNICAL FIELD

The invention relates to a nuclear magnetic measuring device with a measuring device for carrying out nuclear magnetic measurements of a medium.

BACKGROUND

For this, the measuring device comprises a control unit, a generator unit, a first and a second conditioning unit, an antenna unit, a receiving unit and a measuring signal path. The measuring signal path comprises an excitation signal path and a reaction signal path and the antenna unit has an antenna signal path. The excitation signal path and the reaction signal path thereby coincide in the antenna signal path.

The generator unit is designed for generating excitation signals, the first conditioning unit is designed for conditioning the excitation signals and the antenna unit is designed for transmission of the conditioned excitation signals to the medium. Further, the antenna unit is also designed for detection of reactions signals caused by the excitation signals in the medium, the second conditioning unit is designed for conditioning the reaction signals and the receiving unit is designed for receiving the conditioned reactions signals. The control unit is, in particular, designed for controlling the generator unit and the receiving unit. The control unit is further designed for evaluation of the reaction signals.

The excitation signal path leads the excitation signals from the generator unit via the first conditioning unit and via the antenna unit to the medium and the reaction signal path leads the reaction signals from the medium via the antenna unit and via the second conditioning unit to the receiving unit. Thus, the excitation signal path extends from the generator unit into the medium and the first conditioning unit and the antenna unit lie in the excitation signal path. The reaction signal path extends from the medium to the receiving unit and the antenna unit and the second conditioning unit lie in the reaction signal path.

The nuclear magnetic measuring device is designed to carry out nuclear magnetic measurements of the medium during operation and to determine information about the medium from the nuclear magnetic measurements. When the measuring device carries out a nuclear magnetic measurement, precession of atomic nuclei of the medium in the presence of a macroscopic magnetic field, which has previously magnetized the medium, is influenced by excitation of the atomic nuclei to nuclear magnetic resonances, and the nuclear magnetic resonances are evaluated. Therefore, nuclear magnetic measurements are often referred to as nuclear magnetic resonance measurements or magnetic resonance measurements, and corresponding measuring devices are referred to as nuclear magnetic resonance measuring devices or magnetic resonance measuring devices. The nuclear magnetic measuring device has a magnetic field generator for generating the macroscopic magnetic field.

Precession is a property of atomic nuclei of elements having a nuclear spin. Nuclear spin can be regarded as an angular momentum describable by a vector, and accordingly, the magnetic moment caused by the nuclear spin can also be described by a vector that is aligned parallel to the vector of the angular momentum. The presence of a macroscopic magnetic field creates an excess of atomic nuclei with magnetic moments in a medium, which are aligned parallel to the macroscopic magnetic field, whereby the medium has a macroscopic magnetization that can be described overall by a vector. The vector of the magnetic moment of the atomic nucleus precesses around the vector of the macroscopic magnetic field at the location of the atomic nucleus. That is the property precession. The frequency of precession is called the Larmor frequency $\omega_L$ and is proportional to the value of the magnetic flux density B of the macroscopic magnetic field. The Larmor frequency is calculated according to $\omega_L = \gamma \cdot B$, wherein $\gamma$ is the gyromagnetic ratio, which is at a maximum for hydrogen nuclei.

The excitation of the atomic nuclei to nuclear magnetic resonances takes place using excitation signals in the form of measurement excitation signals. Excitation signals are mostly RF signals and are generated by the generator unit, then are lead from the excitation signal path to the first conditioning unit and on the excitation signal path through the first conditioning unit, in which they are conditioned. The conditioned excitation signals are then lead from the excitation signal path to the antenna unit and on the excitation signal path through the antenna unit. The antenna unit transmits the conditioned excitation signals to the medium. For generating excitation signals, the generator device often has a digital-to-analog converter and, for conditioning excitation signals, the first conditioning device usually has an amplifier. The amplifier is usually a power amplifier.

Nuclear magnetic resonances are detected as reaction signals in the form of measurement reaction signals by the antenna unit. Reaction signals are lead from the medium by the reaction signal path to the antenna unit and then on the reaction signal path through the antenna unit. Further, the reaction signals are led by the reaction signal path to the second conditioning unit and on the reaction signal path are lead through the conditioning unit, where they are conditioned. The conditioned reaction signals are then lead from the reaction signal path to the receiving unit, where they are received. The receiving unit often has an analog-to-digital converter for receiving the conditioned reaction signals, and the second conditioning unit comprises an amplifier for conditioning the reaction signals. The amplifier is normally used for amplifying a signal which is very weak compared to the excitation signals.

Measurement excitation signals are excitation signals and excitation signals basically have at least one electromagnetic RF pulse. At least in the case of measurement excitation signals, such an RF pulse usually exhibits the Larmor frequency. Measurement excitation signals have, for example, an activation pulse and at least one refocusing pulse. An activation pulse causes a nuclear magnetic resonance in the form of a macroscopic magnetization of the medium transverse to the vector of the macroscopic magnetic field which rotates around the vector of the macroscopic magnetic field with the Larmor frequency. The rotating transverse macroscopic magnetization can be detected as a measurement reaction signal in the form of a free induction decay, which is abbreviated as FID and/or, after refocusing, can be detected as an echo signal. Thus, a measurement reaction signal has a free induction decay and/or at least one echo signal. A refocusing of the rotating transverse magnetization is then necessary when the relationship—first present after the activation pulse or a refocusing—of the phases of the precessions of the individual magnetic moments of the atomic nuclei are disturbed in relation to one another, for example, due to inhomogeneities in the macroscopic magnetic field. A refocusing is carried out by a refocusing pulse which restores the relationship of the phases and is part of a measurement excitation signal.

The antenna unit has the antenna signal path in which the excitation signal path and the reaction signal path coincide. Furthermore, the antenna unit usually has an antenna changeover switch that connects the antenna signal path to the excitation signal path in a first switching state and, connects the antenna signal path to the reaction signal path in a second switching state. The antenna changeover switch can be designed as an active or passive changeover switch. Often, the antenna changeover switch is a passive changeover switch, the switching state of which is dependent on the power of a signal that propagates over the measuring signal path. If the power exceeds a certain threshold value, then the antenna changeover switch is in the first switching state and if the power is below the determined power threshold value, then it is in the second switching state. Usually, passive antenna changeover switches have diodes as switching elements. If the antenna changeover switch is designed as an active changeover switch, then it is usually controllable. The antenna changeover switch is usually controlled by the control unit. Thus, the antenna signal path carries both the excitation signals and the receive signals, and in this sense, the excitation signal path and the response signal path coincide in the antenna signal path.

Typically, the antenna unit comprises a coil unit. The coil unit usually has a single coil both for transmitting the excitation signals to the medium and for detecting the reaction signals from the medium. However, there are also coil units that have a first coil for transmitting the excitation signals to the medium and a second coil for detecting the reaction signals from the medium. The antenna unit is usually designed as a resonant oscillating circuit with a resonance frequency and has a tuning circuit. The tuning circuit is designed to adjust the resonance frequency of the resonant oscillating circuit taking into account the Larmor frequency, in particular to adjust the resonance frequency to the Larmor frequency. Further, the antenna unit usually has a matching circuit for avoiding signal reflections at the transition from the excitation signal path or the reaction signal path, on the one hand, and the antenna signal path, on the other hand.

The medium often also has several phases. In order to determine information about the individual phases, atomic nuclei of the individual phases must be capable of being excited to distinguishable nuclear magnetic resonances. For example, nuclear magnetic resonances are distinguishable from each other when longitudinal relaxations of the individual phases have longitudinal relaxation time constants $T_1$ differing from one another. Since the multi-phase medium extracted from oil sources essentially has crude oil and (salt)water as a liquid phase and natural gas as a gaseous phase, the atomic nuclei of all phases have hydrogen nuclei and since usually, in particular, the phases crude oil and (salt)water differ by different longitudinal relaxation time constants $T_1$, nuclear magnetic measuring devices are particularly suitable for the determination of information about media extracted from oil sources.

In tests on nuclear magnetic measuring devices of the type described, it has been recognized that properties of the measuring signal path are subject to fluctuations, so that these properties are unstable. It has been recognized that the fluctuations have different causes. Causes are, for example, temperature dependencies, individual variability and aging of components in the measuring signal path such as, for example, the control unit, the generator unit, the first and second conditioning units, the antenna unit and the receiving unit. Properties of the medium are also dependent on the temperature. A further cause is the load on the measuring signal path caused by the medium, whereby the load depends in particular on the conductivity of the medium.

SUMMARY

An object of the present invention is, therefore, to provide a nuclear magnetic measuring device of the type described that determines at least one unstable property of the measuring signal path.

According to the invention, the object is achieved primarily and essentially in that the measuring device has a bypass signal path and a transmission unit, the bypass signal path and the transmission unit are connected to one another, and the transmission unit is designed for bi-directional transmission of signals between the bypass signal path and the antenna signal path. The bi-directional transmission of signals between the bypass signal path and the antenna signal path relates in particular to the transmission of excitation signals from the bypass signal path to the antenna signal path and the transmission of reaction signals from the antenna signal path to the bypass signal path.

The invention is further characterized in that a first changeover switch is arranged such that, in a first switching state, the generator unit is connected to the excitation signal path and, in a second switching state, the generator unit is connected to the bypass signal path, and that a second changeover switch is arranged such that, in a first switching state, the receiving unit is connected to the reaction signal path and, in a second switching state, the receiving unit is connected to the bypass signal path. The first and the second changeover switch each have a first and a second switching state and the switching states are controllable.

Furthermore, the invention is characterized in that the control unit is designed to first control the first changeover switch and the second changeover switch such that a part of the measuring signal path is bypassed by the bypass signal path and then to generate a test excitation signal with the generator unit, to receive a test reaction signal caused by the test excitation signal with the receiving unit, and to determine a property of the measurement signal path using the test excitation signal and the test reaction signal, wherein the property is an unstable property of the measuring signal path. Since the measuring signal path comprises not only the measuring device, but also the medium, the unstable properties include not only those of the measuring device, but also of the medium. The described configuration of the control device ensures that the control device carries out the same during operation. The same applies to any further designs of the control device.

An advantage of the nuclear magnetic measuring device over the described nuclear magnetic measuring device is that it is designed to determine an unstable property of the measuring signal path.

Due to the arrangement of the first changeover switch in the original excitation signal path and the second changeover switch in the original reaction signal path, changes are to be made to the design of the control unit for carrying out nuclear magnetic measurements. Therefore, it is provided in a design of the nuclear magnetic measuring device according to the invention that the control unit is designed to carry out a nuclear magnetic measurement, in that the control unit first sets the first changeover switch into the first switching state and the second changeover switch into the first switching state and then generates a measurement excitation signal, receives a measurement reaction signal caused by the measurement excitation signal, and determines information about the medium using the measurement excitation signal and the measurement reaction signal.

When the first changeover switch is in the first switching state, the excitation signal path extends from the generator unit into the medium, and when the second changeover switch is in the first switching state, the reaction signal path extends from the medium to the receiving unit. The bypass signal path is decoupled.

When it is said that the control unit generates an excitation signal, such as the measurement excitation signal, it is meant that the control unit controls the generator unit accordingly. When it is said that the control unit receives a reaction signal, such as the measurement reaction signal, it is meant that the control unit controls the receiving unit accordingly.

The information about the medium is, for example, a speed of the medium or, if the medium is multi-phase, a speed of a phase of the medium or a property of the medium itself, for example the proportions of the individual phases in the medium, a longitudinal relaxation time constant $T_1$, or a transverse relaxation time constant $T_2$. When the nuclear magnetic measuring device measures a speed of a medium or a speed of a phase of a medium, it is advantageous when the measuring device additionally has a measuring tube through which the medium flows. Such a nuclear magnetic measuring device is also referred to as a nuclear magnetic flowmeter. Preferably, a nuclear magnetic flowmeter is also designed for determining further properties.

In a further development of the above design of the nuclear magnetic measuring device, it is provided that the control unit is further designed to increase an accuracy of the information about the medium using the determined property of the measuring signal path. This design is based on the recognition that, when determining information about the medium using a nuclear magnetic measurement, the consideration of a fluctuation of an unstable property of the measuring signal path causes an increase in the accuracy in the determination of this information.

It has been recognized that such an unstable first property is a gain over the reaction signal path. The gain over the reaction signal path is the gain that a signal undergoes as it propagates along the reaction signal path. Therefore, it is provided in a further design, that the control unit is designed to determine a first property of the measuring signal path in that the control unit first sets the first changeover switch into the second switching state and the second changeover switch into the first switching state and then generates a first test excitation signal, receives a first test reaction signal caused by the first test excitation signal, and, using the first test excitation signal and the first test reaction signal, determines a gain over the reaction signal path as the first property.

When the first changeover switch is in the second switching state and the second changeover switch is in the first switching state, the part of the excitation signal path that extends from the first changeover switch to the transmission unit is bypassed by the bypass signal path. The first conditioning device is located, in particular, in this part of the excitation signal path. The generator device is designed to generate the first test excitation signal as an excitation signal. The test excitation signal is, for example, a measurement excitation signal or a part of a measurement excitation signal. The first test excitation signal generated by the generator unit propagates through the first changeover switch and then to the transmission unit via the bypass signal path. The transmission unit transmits the test excitation signal from the bypass signal path to the reaction signal path. Further, the test excitation signal propagates via the reaction signal path through the second conditioning unit and then through the second change-over switch to the receiving unit. By bypassing the described part of the excitation signal path, the test excitation signal is not influenced by unstable properties, in particular of the first conditioning unit, whereby the test excitation signal at the transmission unit corresponds to that at the generator unit. The test excitation signal is thus only influenced by unstable properties of the reaction signal path, including, in particular, unstable properties of the second conditioning unit and usually also the medium. By influencing the test excitation signal via the reaction signal path, the first test reaction signal becomes from the first test excitation signal. The receiving unit is designed to receive the first test reaction signal as a reaction signal. Thus, the information about gain over the reaction signal path is included in the combination of the test excitation signal and the test reaction signal. According to the invention, it has been recognized that the gain over the reaction signal path determined in this manner between the transmission device and the receiving device corresponds to the gain of a measurement reaction signal over the reaction signal path.

If the control unit is designed to carry out at least one determination of the first property in addition to the nuclear magnetic measurement, there are several implementations for the temporal sequence of the execution of the at least one determination of the first property and the execution of the nuclear magnetic measurement. The control unit correspondingly carries this out during operation of the nuclear magnetic measuring device.

In a design relating thereto, it is provided that the control unit is designed to carry out at least one determination of the first property not during execution of the nuclear magnetic measurement. Thus, there is a time interval between the execution of the at least one determination of the first property and the execution of the nuclear magnetic measurement. Due to the time interval, the respective implementations are carried out sequentially, which is why this embodiment is to be implemented in a simple manner in the measuring device.

In a further design relating thereto, it is provided that the control unit is designed to carry out at least one determination of the first property while carrying out the nuclear magnetic measurement. During the execution of the nuclear magnetic measurement, the measurement excitation signal is generated, which comprises at least one RF pulse. This RF pulse is, for example, an activation pulse. The activation pulse causes a free induction decay, which is part of the measurement reaction signal. Preferably, the at least one determination of the first property is carried out over an interval of the free induction decay, which is not evaluated by the control unit as part of the measurement reaction signal, whereby mutual interference is avoided. This applies, for example, to the part of the free induction decay that has an amplitude that is too small for evaluation by the control unit. Usually, the measurement excitation signal also has at least one refocusing pulse in addition to the activation pulse. Accordingly, in addition to the free induction decay, the measurement reaction signal also has at least one echo signal. Preferably, the at least one determination of the first property then is also or alternatively carried out over an interval of the echo signal, which is not evaluated by the control device as part of the measuring reaction signal, whereby mutual interference is avoided. This applies, for example, to the part of the echo signal that has an amplitude that is too small for evaluation by the control unit. This implementation reduces the time required for the execution of the at least one determination of the first property and the execution of the nuclear magnetic measurement. However, the execution of this implementation in the control unit is more complex than the execution of the preceding implementation.

If the control unit carries out several determinations of the first property during operation, these determinations can be carried out not only either during or not during the execution of the nuclear magnetic measurement, but can also be any combination of implementations of the determinations of the first property during and not during the execution of the nuclear magnetic measurement.

When the control unit is designed to determine the first property of the measuring signal path, then it is advantageous that the control unit is designed to carry out at least a first and a second determination of the first property and to carry out an interpolation of the first property between the at least first and second determination of the first property. The interpolation also allows for a determination of the first property between the at least first and second determination of the first property in terms of time.

In order to compensate or at least reduce the influence of fluctuations of the gain over the reaction signal path, i.e., the determined first property, on a reaction signal such as the measurement reaction signal of a nuclear magnetic measurement, it is advantageous to determine a gain correction factor which, when multiplied by the reaction signal, frees the reaction signal from the influence of the fluctuations of the gain or at least reduces the influence.

For this reason, it is provided in one design of the nuclear magnetic measuring device that the control unit is designed to set both the first changeover switch and the second changeover switch into the first switching state, and then to generate a first reference excitation signal, to receive a first reference reaction signal caused by the first reference excitation signal, to determine a first reference amplitude of the first reference reaction signal, to determine a reference gain of the reaction signal path using the first reference excitation signal and the first reference reaction signal, and to determine a gain correction factor using the first reference amplitude, the reference gain and the gain over the reaction signal path.

Written as a formula, the gain correction factor is:

$$\text{Gain Correction Factor} = \frac{\text{Reference} - \text{Gain}}{(\text{Gain}) \cdot (\text{Reference} - \text{Amplitude})}$$

The reference excitation signal is thereby preferably a measurement excitation signal such as, for example, a CPMG excitation signal. A CPMG excitation signal has a Carr Purcell Meiboom Gill pulse sequence. The medium is preferably sedentary and has no fast components. Such a medium is, for example, demineralized water with copper sulfate ($CuSo_4$).

After already having recognized that the gain is an unstable first property over the reaction signal path, it was also recognized that an unstable second property is a magnetic flux density in the medium. In general, the magnetic flux density in the medium is caused by an excitation signal generated by the generator unit. Thus, this magnetic flux density is not caused by the magnetizing device. The magnetic flux density is unstable in the sense that a certain excitation signal causes different magnetic flux densities when transmitted multiply to the medium. This is caused by fluctuations in the properties of the measuring signal path, in particular of the excitation signal path.

Thus, it is provided in a further design of the nuclear magnetic measuring device according to the invention that that the control unit is designed to determine a second property of the measuring signal path in that the control unit first sets the first changeover switch into the first switching state and the second changeover switch into the second switching state, and then generates a second test excitation signal, receives a second test reaction signal caused by the second test excitation signal, and, using the second test excitation signal and the second test reaction signal, determines a magnetic flux density in the medium as the second property.

When the first changeover switch is in the first switching state and the second changeover switch is in the second switching state, the part of the reaction signal path that extends from the transmission unit to the second changeover switch is bypassed by the bypass signal path. In particular, the second conditioning unit is located in this part of the reaction signal path. The generator unit is designed to generate the second test excitation signal as an excitation signal. The test excitation signal is, for example, a measurement excitation signal or a part of a measurement excitation signal. The second test excitation signal generated by the generator unit propagates over the excitation signal path through the first changeover switch, the first conditioning unit and the antenna unit into the medium. The test excitation signal causes the second test reaction signal in the medium, wherein the second test reaction signal has information about the magnetic flux density in the medium. The second test reaction signal propagates over the reaction signal path to the transmission unit. The transmission unit transmits the test reaction signal from the response signal path to the bypass signal path. Furthermore, the test reaction signal propagates over the bypass signal path through the second changeover switch to the receiving unit. By bypassing the described part of the reaction signal path, the test reaction signal is not influenced by unstable properties, in particular of the second conditioning device, whereby the test reaction signal at the receiving unit corresponds to that at the transmission unit. The test reaction signal is thus influenced only by unstable properties of the excitation signal path, which in particular include unstable properties of the first conditioning unit and of the medium. The receiving unit is designed to receive the second test reaction signal as a reaction signal. Thus, information about the magnetic flux density in the medium is contained in the combination of the test excitation signal and in the test reaction signal. According to the invention, it has been recognized that the magnetic flux density determined in this manner corresponds to a magnetic flux density generated in the medium by means of an excitation signal.

In a further development of the above designs, it is provided that the control unit is designed to integrate the magnetic flux density over an interval. The integral of the magnetic flux density is thereby a measure of the angle between the vector of the macroscopic magnetic field generated by the magnetization unit and the vector of the precise magnetization of the medium generated by the second test excitation signal and the magnetic flux density. Since this angle depends not only on the absolute value of the magnetic flux density, but also on the composition of the second test excitation signal, the second property is determined more precisely. The composition of the second test excitation signal includes, in particular, the duration and the temporal course of the second test excitation signal.

If the control unit is designed to carry out, in addition to the nuclear magnetic measurement, at least one determination of the second property, there are several implementations for the temporal sequence of the execution of the at least one determination of the second property and the execution of the nuclear magnetic measurement. During operation of the nuclear magnetic measuring device, the control unit correspondingly carries this out.

In a design relating thereto, it is provided that the control unit is designed to carry out at least one determination of the second property not during execution of the nuclear magnetic measurement. Thus there is a time interval between the execution of the at least one determination of the second property and the execution of the nuclear magnetic measurement. Due to the time interval, the respective executions are carried out sequentially, which is why this embodiment is to be implemented in a simple manner in the measuring device.

In a further design relating thereto, it is provided that the control unit is designed to carry out at least one determination of the second property during execution of the nuclear magnetic measurement and to use the measurement excitation signal as second test excitation signal. During the execution of the nuclear magnetic measurement, the measuring excitation signal is generated by the generator device, the measuring excitation signal having at least one RF pulse. This RF pulse is, for example, an activation pulse. If the measurement excitation signal has further RF pulses, one of the further RF pulses is, for example, a refocusing pulse. Preferably, the activation pulse and/or refocusing pulse is used as the second test excitation signal. This implementation reduces the time required for the execution of the at least one determination of the second property and the execution of the nuclear magnetic measurement. However, the execution of this implementation in the control unit is more complex than the execution of the preceding implementation.

If the control device carries out several determinations of the second property during operation, these determinations can be carried out not only either during or not during the execution of the nuclear magnetic measurement, but can also be any combination of implementations of the determination of the second property during and not during the execution of the nuclear magnetic measurement. The same also applies for a combination of implementations for determining the first property and the second property.

If the control unit is designed to determine the second property of the measuring signal path, then it is advantageous that the control unit is designed to carry out at least a first determination and a second determination of the second property and to carry out an interpolation of the second property between the at least first and second determination of the second property. The interpolation also allows for a determination of the second property between the at least first and second determination of the second property in terms of time.

For the compensation or at least reduction of fluctuations in the magnetic flux density in the medium, i.e, the second property, it is advantageous to determine an ideal 90° pulse. The ideal 90° pulse is characterized in that fluctuations in the properties of the measuring signal path, in particular of the excitation signal path, are taken into account, so that a deviation from a rotation by 90° about an axis of the magnetization of the medium by the ideal 90° pulse as excitation signal is less than the deviation by an ordinary 90° pulse.

For this reason, it is provided in a design of the nuclear magnetic measuring device that the control unit is designed to first set the first changeover switch into the first switching state and the second changeover switch into the first switching state, and then to generate a second reference excitation signal, to receive a second reference reaction signal caused by the second reference excitation signal, to determine a reference 90° pulse and reference magnetic flux density using the second reference excitation signal and the second reference reaction signal, and to determine a 90° pulse using the reference 90° pulse, the reference magnetic flux density and the magnetic flux density. The reference 90° pulse causes a rotation of the magnetization of the medium by exactly 90°. Alternatively or additionally, the control device is designed to determine the same for a 180° pulse. A parameter of RF pulses is their respective duration, wherein the amount of rotation of the magnetization of the medium is adjustable over the duration. For example, for a first duration the rotation is 90° and for a second duration 180°. These pulses are suitable since they are often used in excitation signals such as, for example, activation pulses and refocusing pulses.

Written as a formula, the ideal 90° pulse is:

$$\text{Ideal } 90° \text{ Pulse} = \frac{(\text{Reference} - 90° \text{ Pulse}) \cdot (\text{Magnetic Reference} - \text{Flux Density})}{\text{Magnetic Flux Density}}$$

The reference excitation signal is preferably a measurement excitation signal, such as, for example, a P90CPMG excitation signal. Such an excitation signal has at least a 90° pulse. The medium is preferably stagnant. Such a medium is, for example, demineralized water with copper sulfate.

It is provided in a further design of the nuclear magnetic measuring device that the control unit is designed to determine a third property of the measuring signal path in that the control unit first sets the first changeover switch into the second switching state and the second changeover switch into the second switching state, and then generates a third test excitation signal, receives a third test reaction signal caused by the third test excitation signal, and, using the third test excitation signal and the third test reaction signal, determines a transmission function of the bypass signal path as third property. Preferably, the control means is designed to increase an accuracy of determining an unstable property such as the first property and/or the second property using the third property. Not only does the measuring signal path not have ideal transmission properties, but also the bypass signal path. These non-ideal properties of the bypass signal path are included in the transmission function and can be taken into account after being determined. If the non-ideal properties of the bypass signal path are not taken into account, they affect the accuracy of the determination of an unstable property.

It is provided in a further design that the transmission unit has a galvanic separation. Due to the galvanic separation, the bi-directional transmission of signals between the bypass signal path and the antenna signal path is carried out electrically separated from one another.

In a further development of the above design, it is provided that the galvanic separation is implemented by an air transformer.

In a further development alternative to the above further development, it is provided that galvanic separation is implemented by a first air transformer for transmission of signals from the bypass signal path to the antenna signal path and by a second air transformer for transmission of signals from the antenna signal path to the bypass signal path.

In detail, there is a plurality of possibilities to design and further develop the nuclear magnetic measuring device. Reference is made to both the patent claims subordinate to the independent patent claims as well as to the following description of a preferred embodiment in conjunction with the drawings.

DETAILED DESCRIPTION

Figure 1:
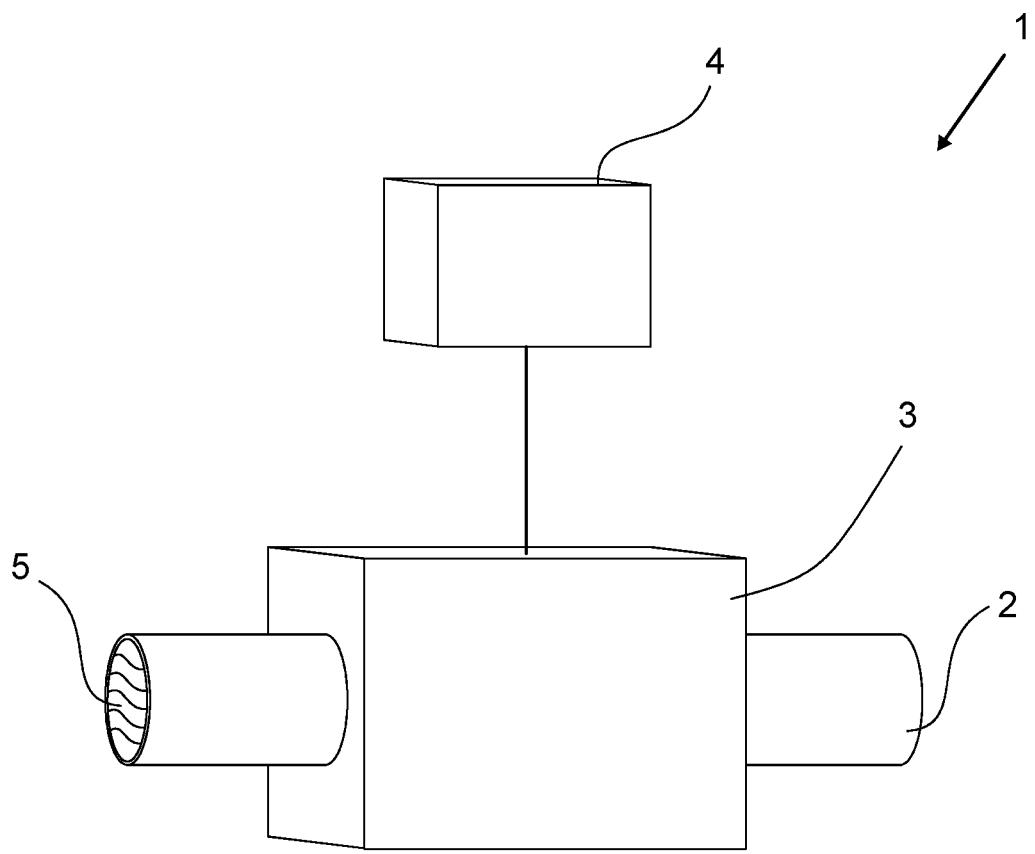
FIG. 1 illustrates an embodiment of a nuclear magnetic measuring device.

FIG. 1 shows, in an abstracted perspective view, the nuclear magnetic measuring device 1, which is designed in this embodiment as a nuclear magnetic flowmeter. The nuclear magnetic measuring device 1 has the measuring tube 2, the magnetization device 3 and the measuring device 4. Since the nuclear magnetic measuring device 1 is in operation, the medium 5 is present in the measuring tube 2, and the magnetization device 3 magnetizes the medium 5 present in the measuring tube 2 so that nuclear magnetic measurements can be carried out on the medium 5 by the measuring device 4.

Figure 2:
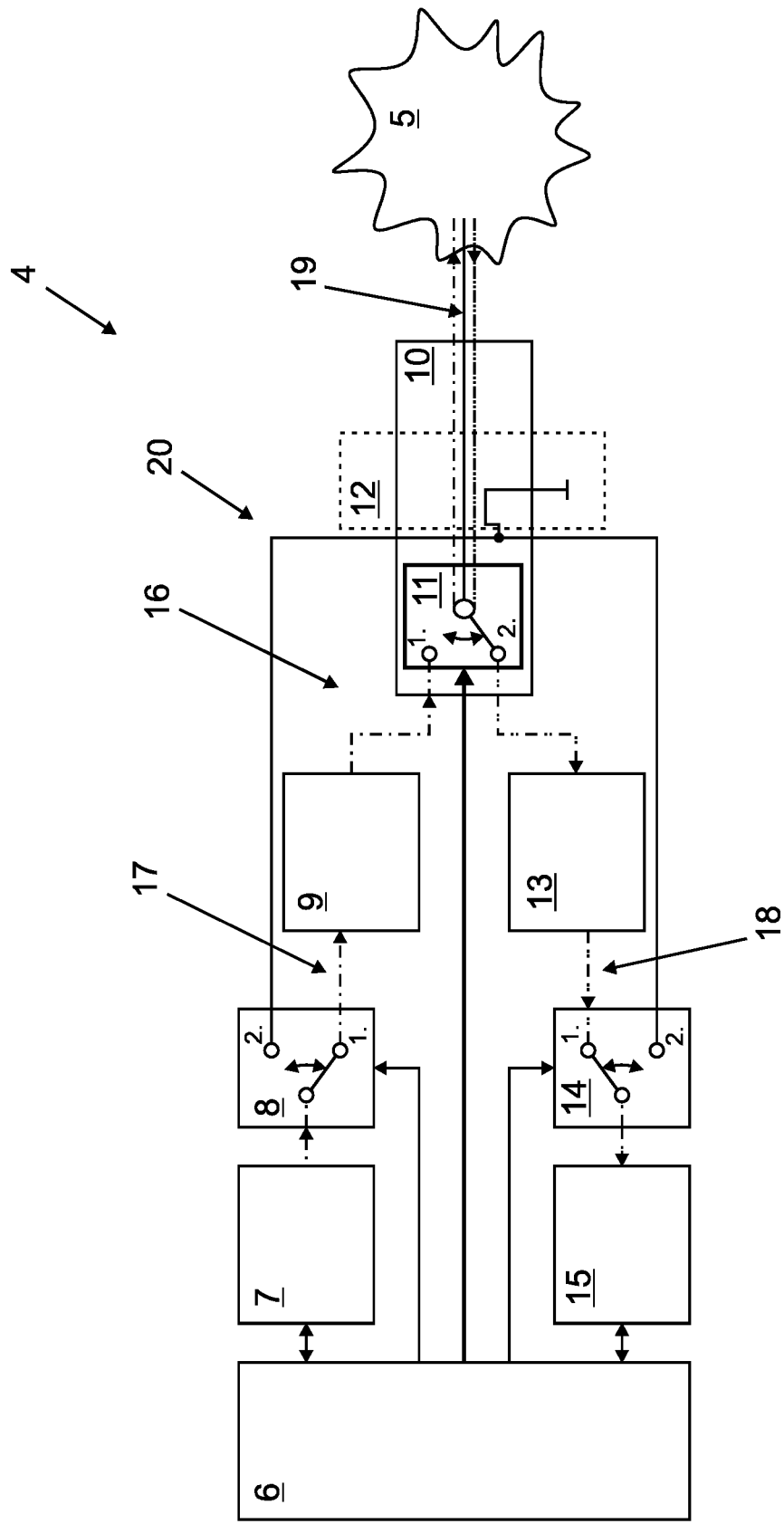
FIG. 2 illustrates a measuring device of the nuclear magnetic measuring device.

FIG. 2 shows essential components of the measuring device 4 in a block diagram. The measuring device 4 has the control unit 6, the generator unit 7, the first changeover switch 8, the first conditioning unit 9, the antenna unit 10 with the changeover switch 11, the transmission unit 12, the second conditioning device 13, the second changeover switch 14, and the receiving unit 15.

Furthermore, the measuring device 4 has the measuring signal path 16, which comprises the excitation signal path 17 and the reaction signal path 18. The excitation signal path 17 is shown as a dot-dash line and the reaction signal path 18 is shown as a dash-dot-dot line. In addition, the measuring device 4 also has the antenna signal path 19, wherein the excitation signal path 17 and the reaction signal path 18 coincide in the antenna signal path 19. Furthermore, the measuring device 4 also has the bypass signal path 20. The bypass signal path 20 and the transmission unit 12 are connected to one another, and the transmission unit 12 is designed for the bidirectional transmission of signals between the bypass signal path 20 and the antenna signal path 19.

The generator unit 7 is designed for generating excitation signals, the first conditioning unit 9 for conditioning the excitation signals, and the antenna unit 10 for transmitting the conditioned excitation signals to the medium 5. Furthermore, the antenna unit 10 is designed for the detection of reaction signals caused by the excitation signals in the medium 5, the second conditioning unit 13 for conditioning the reaction signals, and the receiving unit 14 for receiving the conditioned reaction signals. The generator unit 7 has a digital-to-analog converter for generating the excitation signals; the first conditioning unit 9 has a power amplifier for conditioning the excitation signals; the antenna unit 10 has a coil unit for transmitting the excitation signals to the medium 5 and for detecting the reaction signals; the second conditioning unit has an amplifier for weak signals for conditioning the reaction signals; and the receiving unit 15 has an analog-to-digital converter for receiving the reaction signals.

The first changeover switch 9 is arranged in such a manner that, in a first switching state, the generator unit 7 is connected to the excitation signal path 17 and, in a second switching state, the generator unit 7 is connected to the bypass signal path 20. The second changeover switch 14 is arranged in such a manner that, in a first switching state, the receiving unit 15 is connected to the reaction signal path 18 and, in a second switching state, the receiving unit 15 is connected to the bypass signal path 20. The antenna changeover switch 11, in a first switching state, connects the antenna signal path 19 to the excitation signal path 17 and, in a second switching state, connects the antenna signal path 19 to the reaction signal path 18. Thus, the antenna signal path carries both the excitation signals and the receiving signals and, in this sense, the excitation signal path 17 and the reaction signal path 18 coincide in the antenna signal path 19.

The control unit 6 is designed to control the generator unit 7, the receiver unit 15, the first changeover switch 8, the second changeover switch 14 and the antenna changeover switch 11, which is symbolized by arrows in FIG. 2.

Figure 3A:
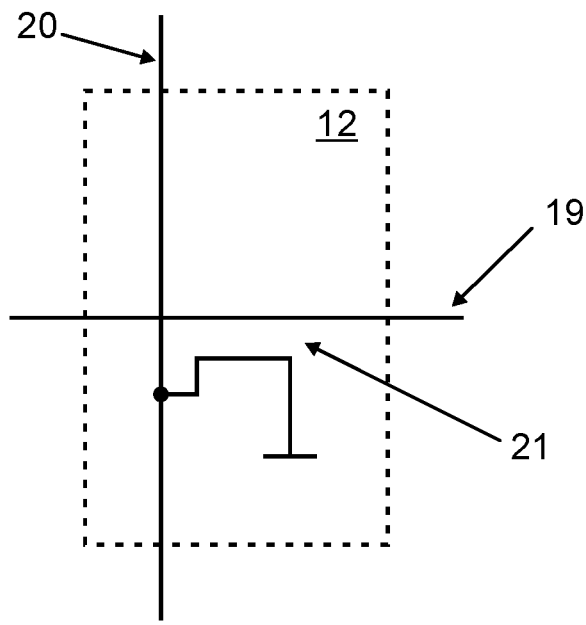
FIGS. 3a and 3b illustrate two embodiments of a transmission unit of the measuring device.

FIG. 3a is a section of FIG. 2 and shows the transmission unit 12. The transmission unit 12 has a galvanic separation, so that the bi-directional transmission of signals between the bypass signal path 20 and the antenna signal path 19 is carried out galvanically separated. The galvanic separation is implemented by the first air transformer 21. The first air transformer 21 inductively couples the bypass signal path 20 and the antenna signal path 19 to one another. The first air transformer 21 transmits signals bi-directionally between the bypass signal path 20 and the antenna signal path 19.

Figure 3B:
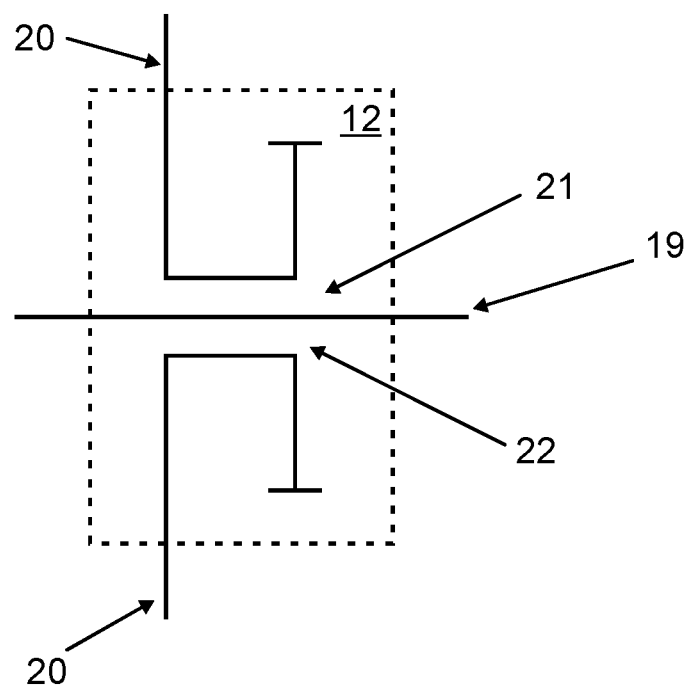

FIG. 3b shows an alternative embodiment of the transmission unit 12 shown in FIG. 3a. In the alternative embodiment, the bypass signal path 20 is electrically separated into two sections, and the transmission unit 12 also has the second air transformer 22 in addition to the first air transformer 21. The first air transformer 21 inductively couples the one section of the bypass signal path 20 and the antenna signal path 19 to one another to transmit signals from the bypass signal path 20 to the antenna signal path 19, and the second air transformer 22 inductively couples the other section of the bypass signal path 20 and the antenna signal path 19 to one another to transmit signals from the antenna signal path 19 to the bypass signal pad 20. The transmission of signals between the bypass signal path 20 and the antenna signal path 19 is galvanically separated by the first air transformer 21 and the second air transformer 22.

When the control unit 6 in FIG. 2 has set the first changeover switch 8 into the first switching state and the antenna changeover switch 11 into the first switching state and has triggered the generator unit 7 to generate excitation signals, the excitation signal path 17 leads the excitation signals from the generator unit 7 via the first changeover switch 8, via the antenna changeover switch 11, via the first conditioning unit 9, and via the antenna unit 10 to the medium 5. When the control device 6 has set the second changeover switch 14 into the first switching state and the antenna changeover switch 11 into the second switching state, the reaction signal path 18 leads reaction signals from the medium 5 via the antenna unit 10, via the antenna changeover switch 11, via the second conditioning unit 13 and via the second changeover switch 14 to the receiving device 15.

The control unit 6 is designed to carry out a nuclear magnetic measurement in that the control unit 6 first sets the first changeover switch 8 and the second changeover switch 14 into the first switching state. The control unit 6 then sets the antenna changeover switch 11 into the first switching state, then generates a measuring excitation signal, then sets the antenna changeover switch 11 from the first to the second switching state, then receives a measurement reaction signal caused by the measurement excitation signal and, using the measurement excitation signal and the measurement reaction signal, determines information about the medium.

When the control unit 6 has set the first changeover switch 8 into the second switching state and the second changeover switch 14 into the first switching state, the part of the excitation signal path 17 that extends from the first changeover switch 8 to the transmission unit 12 is bypassed by the bypass signal path 20. The first conditioning unit 9, in particular, is located in this part of the excitation signal path 17. When the control unit 6 has set the first changeover switch 8 into the first switching state and the second changeover switch 14 into the second switching state, the part of the reaction signal path 18 that extends from the transmission device 12 to the second changeover switch 14 is bypassed by the bypass signal path 20. The second conditioning unit 13, in particular, is located in this part of the reaction signal path 18. Accordingly, the control unit 6 is designed to control the first changeover switch 8 and the second changeover switch 14 so that part of the measuring signal path 16 is bypassed by the bypass signal path 20.

When a part of the measuring signal path 16 is bypassed by the bypass signal path 20, the control unit 6 is designed to generate a test excitation signal with the generator unit 7, to receive a test reaction signal caused by the test excitation signal with the receiving device 15, to determine a property of the measurement signal path 16 using the test excitation signal and the test reaction signal, and to increase an accuracy of information about the medium 5 from a nuclear magnetic measurement using the property of the measurement signal path.

In this embodiment, the control unit 6 is designed to determine a first and a second property of the measuring signal path 16 and to use the information about the medium 5 to increase the accuracy.

The first property of the measuring signal path 16 is a gain over the reaction signal path 18. This is determined in that the control unit 6 sets the first changeover switch 8 into the second switching state and the second changeover switch 14 into the first switching state and then generates a first test excitation signal, receives a first test reaction signal caused by the first test excitation signal, and determines the gain using the first test excitation signal and the first test reaction signal.

The second property of the measuring signal path 16 is a magnetic flux density in the medium 5. This is determined in that the control unit 6 first sets the first changeover switch 8 into the first switching state and the second changeover switch 14 into the second switching state, and then generates a second test excitation signal, receives a second test reaction signal caused by the second test excitation signal, and determines the magnetic flux density in the medium 5 using the second test excitation signal and the second test response signal.

The control unit 6 is designed to carry out the determination of the gain and/or the determination of the magnetic flux density during and/or not during execution of a nuclear magnetic measurement.

Figure 4A:
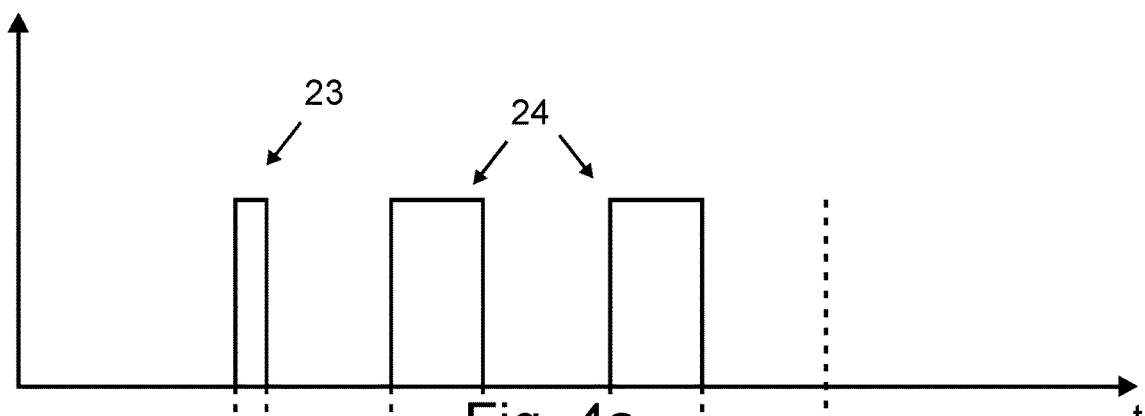
FIGS. 4a to 4d illustrate a sequence of signals, generated and received by the measuring unit.
Figure 4B:
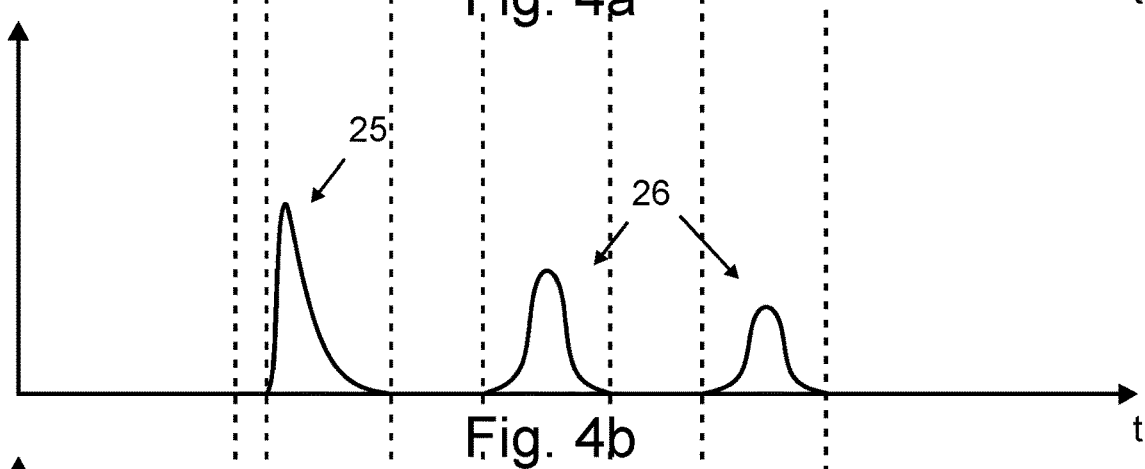

FIGS. 4a to 4d show a first embodiment. The FIGS. 4a and 4b show the execution of a nuclear magnetic measurement. There, FIG. 4a shows the activation pulse 23 and the two refocusing pulses 24 as measuring excitation signal and FIG. 4b shows the free induction decay 25 and the two echo signals 26 as the measurement reaction signal.

Figure 4C:
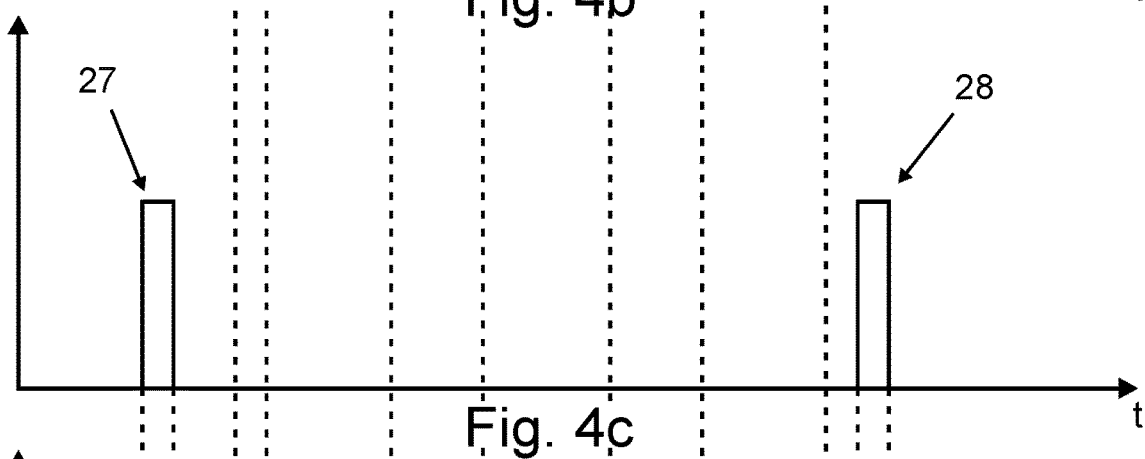

FIG. 4c shows the first execution 27 and the second execution 28 of the determination of the gain of the reaction signal path 18. The first execution 27 is before and the second execution 28 is after the execution of the nuclear magnetic measurement in terms of time. Thus, the first execution 27 and the second execution 28 of the determination of the gain of the reaction signal path 18 are carried out not during the execution of the nuclear magnetic measurement.

Figure 4D:
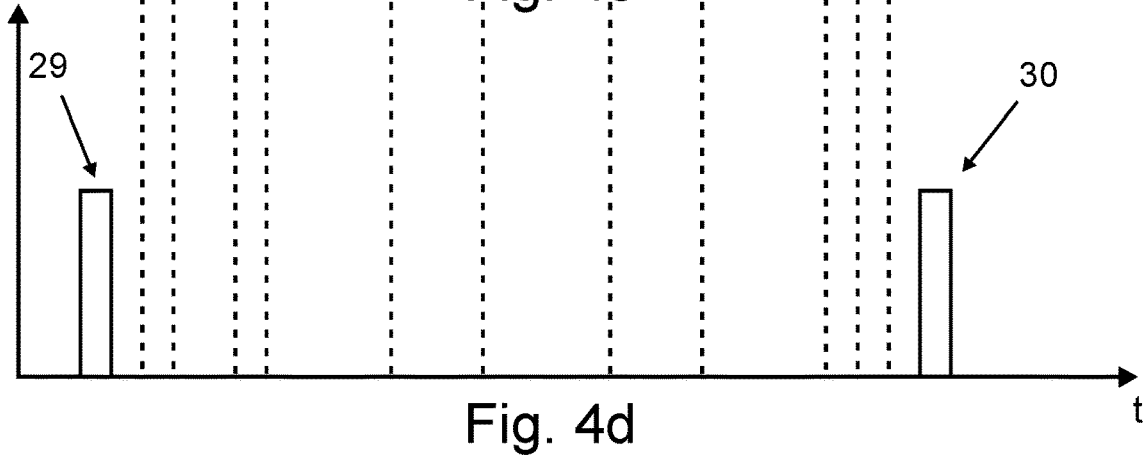

FIG. 4d shows the first execution 29 and the second execution 30 of the determination of the magnetic flux density of the medium 5. The first execution 29 is before and the second execution 30 is after the execution of the nuclear magnetic measurement in terms of time. Thus, the first execution 29 and the second execution 30 of the determination of the magnetic flux density of the medium 5 are carried out not during the execution of the nuclear magnetic measurement. Further, the first execution 29 of the determination of the magnetic flux density of the medium 5 is before the first execution 27 of the determination of the gain of the reaction signal path 18 in terms of time and the second execution 30 of the determination of the magnetic flux density of the medium 5 is after the second execution 28 of the determination of the gain of the reaction signal path 18 in terms of time. The reason for this is that the execution of the determination of the magnetic flux density of the medium 5 influences a nuclear magnetic measurement, which is why a time interval is necessary.

Figure 5A:
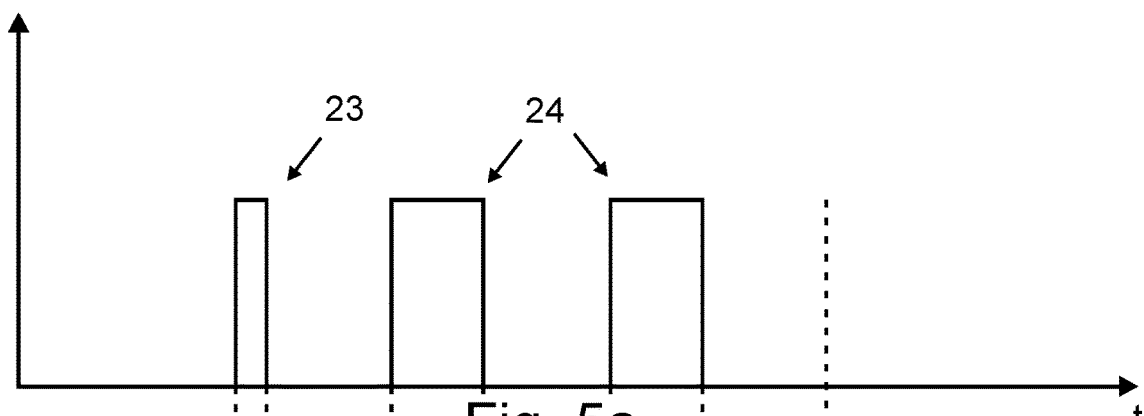
FIGS. 5a to 5d illustrate a further sequence of signals, generated and received by the measuring unit.
Figure 5B:
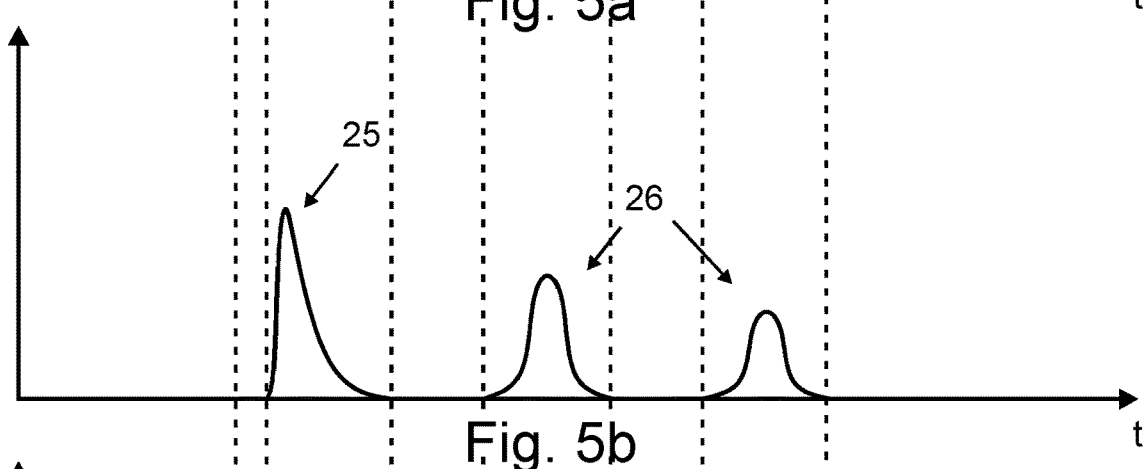

FIGS. 5a to 5d show a second embodiment. FIGS. 5a and 5b show the execution of a nuclear magnetic measurement already known from FIGS. 4a and 4b.

Figure 5C:
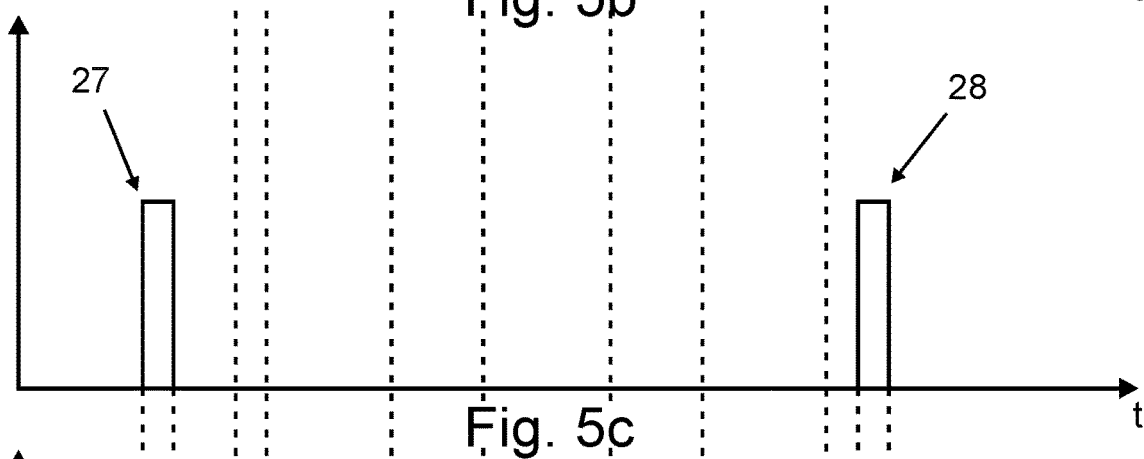

FIG. 5c shows the first execution 27 and the second execution 28 of the determination of the gain of the reaction signal path 18. The first execution 27 is before and the second execution 28 is after the execution of the nuclear magnetic measurement in terms of time. Thus, the first execution 27 and the second execution 28 of the determination of the gain of the reaction signal path 18 are carried out not during the execution of the nuclear magnetic measurement.

Figure 5D:
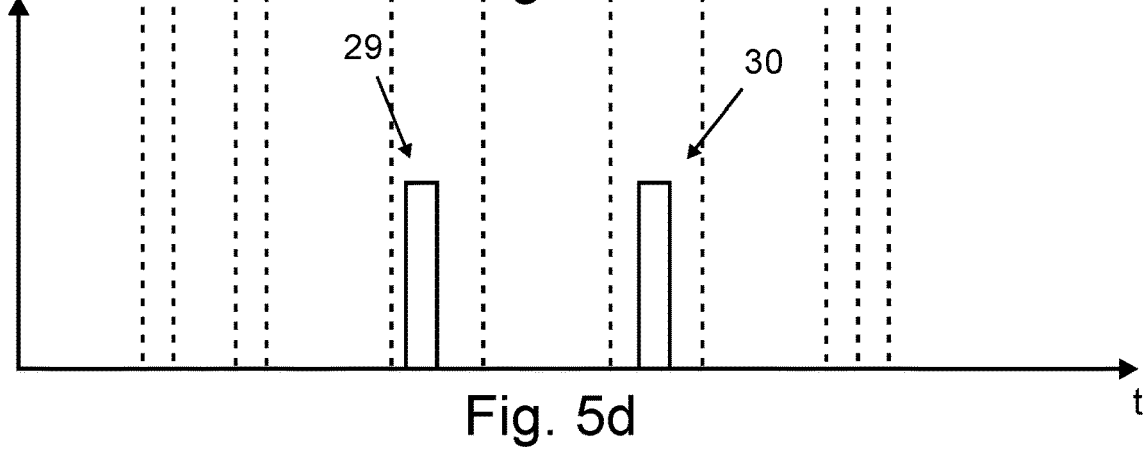

FIG. 5d shows the first execution 29 and the second execution 30 of the determination of the magnetic flux density of the medium 5. The first execution 29 and the second execution 30 are carried during the execution of the nuclear magnetic measurement, namely the refocusing pulses 24 are used as second test excitation signals. By using the refocusing pulses as second test excitation signals, the nuclear magnetic measurement is not influenced by the execution of the determination of the magnetic flux density of the medium 5.

Figure 6A:
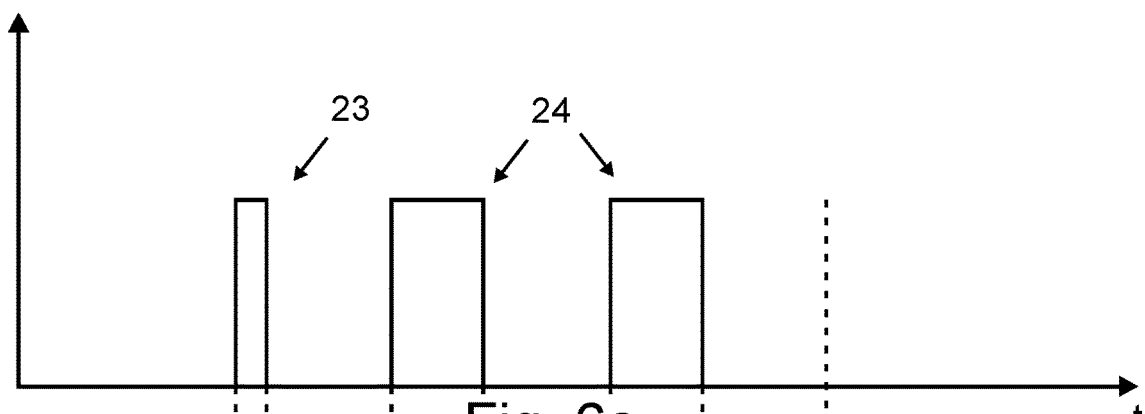
FIGS. 6a to 6d illustrate another further sequence of signals, generated and received by the measuring unit.
Figure 6B:
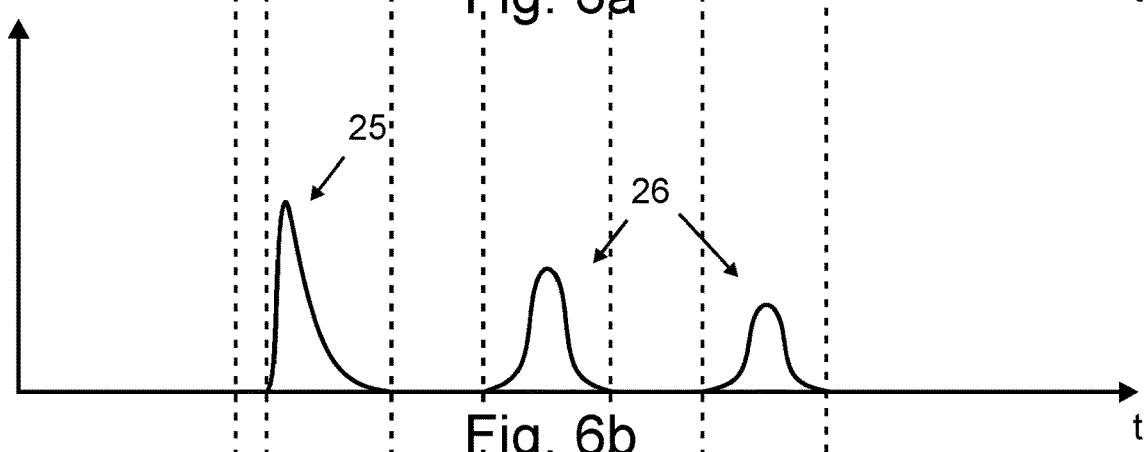

FIGS. 6a to 6d show a third embodiment. FIGS. 6a and 6b show the execution of a nuclear magnetic measurement already known from FIGS. 4a and 4b.

Figure 6C:
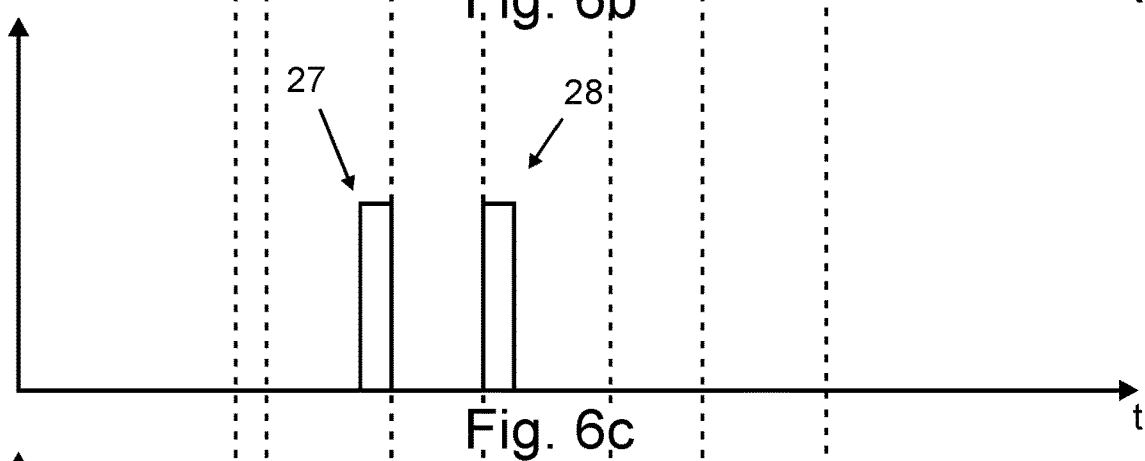

FIG. 6c shows the first execution 27 and the second execution 28 of the determination of the gain of the reaction signal path 18. The first execution 27 and the second execution 28 are carried out during the execution of the nuclear magnetic measurement, namely during the free induction decay 25 and the first of the two echo signals 26. Thereby, intervals of the free induction decay 25 and of the echo signal 26 are used, which are not used as a measurement reaction signal in the nuclear magnetic measurement.

Figure 6D:
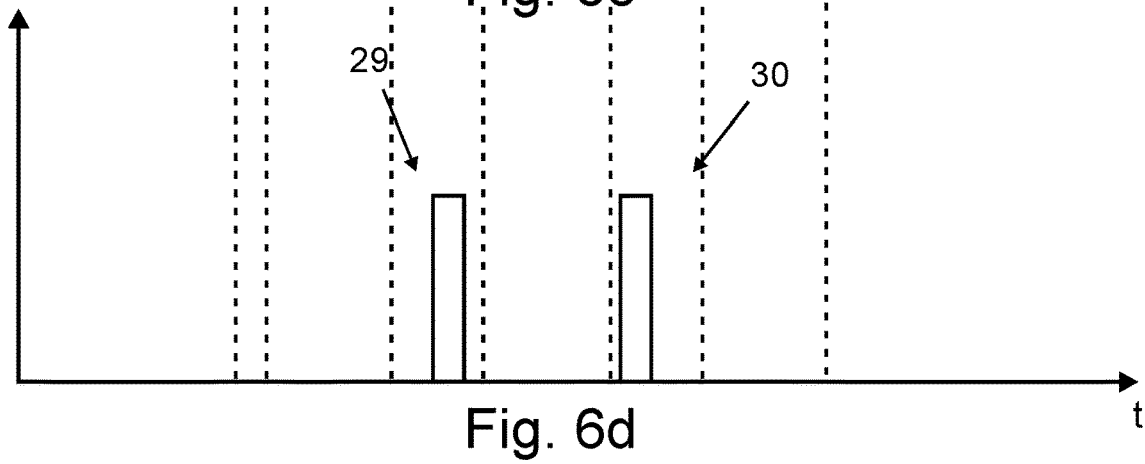

FIG. 6d shows the first execution 29 and the second execution 30 of the determination of the magnetic flux density of the medium 5. The first execution 29 and the second execution 30 are carried out during the execution of the nuclear magnetic measurement, namely the refocusing pulses 24 are used as second test excitation signals. By using the refocusing pulses as second test excitation signals, the nuclear magnetic measurement is not influenced by the execution of the determination of the magnetic flux density of the medium 5.

While the first embodiment is easier to implement in the control unit 6 compared to the two other embodiments, the execution time of the third embodiment is shorter compared to the other two embodiments.

The invention claimed is:

1. A nuclear magnetic measuring device, comprising:
a measuring device for carrying out nuclear magnetic measurements of a medium, the measuring device including:
a control unit;
a generator unit for generating excitation signals;
a first conditioning unit for conditioning the excitation signals;
an antenna unit for transmission of the conditioned excitation signals to the medium and for detecting reaction signals caused by the excitation signals in the medium;
a second conditioning unit for conditioning the reaction signals;
a receiving unit for receiving the conditioned reaction signals, and
a measuring signal path, wherein the measuring signal path includes an excitation signal path and a reaction signal path, the excitation signal path leading the excitation signals from the generator unit via the first conditioning unit and the antenna unit to the medium, and the reaction signal path leading the reaction signals from the medium via the antenna unit and the second conditioning unit to the receiving unit;
wherein the antenna unit has an antenna signal path, and the excitation signal path and the reaction signal path coincide in the antenna signal path;
wherein the measuring device has a bypass signal path and a transmission unit, the bypass signal path and the transmission unit are connected to one another, and the transmission unit is designed for bidirectional transmission of signals between the bypass signal path and the antenna signal path;
wherein a first changeover switch is arranged such that, in a first switching state, the generator unit is connected to the excitation signal path and, in a second switching state, the generator unit is connected to the bypass signal path;
wherein a second changeover switch is arranged such that, in a first switching state, the receiving unit is connected to the reaction signal path and, in a second switching state, the receiving unit is connected to the bypass signal path; and
wherein the control unit is designed to first control the first changeover switch and the second changeover switch such that a part of the measuring signal path is bypassed by the bypass signal path, and then to generate a test excitation signal with the generator unit, to receive a test reaction signal caused by the test excitation signal with the receiving unit, and to determine a property of the measurement signal path using the test excitation signal and the test reaction signal.

2. The nuclear magnetic measuring device according to claim 1, wherein the control unit is designed to carry out a nuclear magnetic measurement, wherein the control unit first sets the first changeover switch into the first switching state and the second changeover switch into the first switching state, and then generates a measurement excitation signal, receives a measurement reaction signal caused by the measurement excitation signal, and determines information about the medium using the measurement excitation signal and the measurement reaction signal.

3. The nuclear magnetic measuring device according to claim 2, wherein the control unit is designed to increase an accuracy of the information about the medium using the property of the measuring signal path.

4. The nuclear magnetic measuring device according to claim 2, wherein the control unit is designed to determine a first property of the measuring signal path, wherein the control unit first sets the first changeover switch into the second switching state and the second changeover switch into the first switching state, and then generates a first test excitation signal, receives a first test reaction signal caused by the first test excitation signal, and, using the first test excitation signal and the first test reaction signal, determines a gain over the reaction signal path as the first property.

5. The nuclear magnetic measuring device according to claim 4, wherein the control unit is designed to carry out at least one determination of the first property not during execution of the nuclear magnetic measurement.

6. The nuclear magnetic measuring device according to claim 4, wherein the control unit is designed to carry out at least one determination of the first property during execution of the nuclear magnetic measurement.

7. The nuclear magnetic measuring device according to claim 4, wherein the control unit is designed to carry out at least a first and a second determination of the first property and to carry out an interpolation of the first property between the at least first and second determination of the first property.

8. The nuclear magnetic measuring device according to claim 4, wherein the control unit is designed to first set the first changeover switch into the first switching state and the second changeover switch into the first switching state, and then to generate a first reference excitation signal, to receive a first reference reaction signal caused by the first reference excitation signal, to determine a first reference amplitude of the first reference reaction signal, to determine a reference gain of the reaction signal path using the first reference excitation signal and the first reference reaction signal, and to determine a gain correction factor using the first reference amplitude, the reference gain and the gain over the reaction signal path.

9. The nuclear magnetic measuring device according to claim 4, wherein the control unit is designed to determine a second property of the measuring signal path, wherein the control unit first sets the first changeover switch into the first switching state and the second changeover switch into the second switching state, and then generates a second test excitation signal, receives a second test reaction signal caused by the second test excitation signal, and, using the second test excitation signal and the second test reaction signal, determines a magnetic flux density in the medium as the second property.

10. The nuclear magnetic measuring device according to claim 9, wherein the control unit is designed to integrate the magnetic flux density over an interval.

11. The nuclear magnetic measuring device according to claim 9, wherein the control unit is designed to carry out at least one determination of the second property not during execution of the nuclear magnetic measurement.

12. The nuclear magnetic measuring device according to claim 9, wherein the control unit is designed to carry out at least one determination of the second property during execution of the nuclear magnetic measurement and to use the measurement excitation signal as second test excitation signal.

13. The nuclear magnetic measuring device according to claim 9, wherein the control unit is designed to carry out at least a first determination and a second determination of the second property and to carry out an interpolation of the second property between the at least first and second determination of the second property.

14. The nuclear magnetic measuring device according to claim 9, wherein the control unit is designed to first set the first changeover switch into the first switching state and the second changeover switch into the first switching state, and then to generate a second reference excitation signal, to receive a second reference reaction signal caused by the second reference excitation signal, to determine a reference 90° pulse and reference magnetic flux density using the second reference excitation signal and the second reference reaction signal, and to determine a 90° pulse using the reference 90° pulse, the reference magnetic flux density and the magnetic flux density.

15. The nuclear magnetic measuring device according to claim 9, wherein the control unit is designed to determine a third property of the measuring signal path, wherein the control unit first sets the first changeover switch into the second switching state and the second changeover switch into the second switching state, and then generates a third test excitation signal, receives a third test reaction signal caused by the third test excitation signal, and, using the third test excitation signal and the third test reaction signal, determines a transmission function of the bypass signal path as third property.

16. The nuclear magnetic measuring device according to claim 1, wherein the transmission unit has a galvanic separation.

17. The nuclear magnetic measuring device according to claim 16, wherein galvanic separation is implemented by an air transformer.

18. The nuclear magnetic measuring device according to claim 16, wherein galvanic separation is implemented by a first air transformer for transmission of signals from the bypass signal path to the antenna signal path and by a second air transformer for transmission of signals from the antenna signal path to the bypass signal path.

* * * * *